United States Patent
Hasegawa

(10) Patent No.: US 11,094,603 B2
(45) Date of Patent: Aug. 17, 2021

(54) POWER SEMICONDUCTOR DEVICE, ROTATING ELECTRIC MACHINE INCLUDING SAME, AND METHOD OF MANUFACTURING POWER SEMICONDUCTOR DEVICE

(71) Applicant: DENSO CORPORATION, Kariya (JP)

(72) Inventor: Shou Hasegawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 139 days.

(21) Appl. No.: 16/356,107

(22) Filed: Mar. 18, 2019

(65) Prior Publication Data

US 2019/0287871 A1  Sep. 19, 2019

(30) Foreign Application Priority Data

Mar. 16, 2018 (JP) .............................. JP2018-048766

(51) Int. Cl.
*H01L 23/31* (2006.01)
*H01L 23/482* (2006.01)
(Continued)

(52) U.S. Cl.
CPC .......... *H01L 23/3107* (2013.01); *H01L 21/56* (2013.01); *H01L 23/3675* (2013.01);
(Continued)

(58) Field of Classification Search
CPC ............... H01L 23/3107; H01L 23/482; H01L 23/3675; H01L 21/56; H01L 2224/33181; H01L 23/3142; H01L 23/3135; H01L 23/562; H01L 23/051; H02K 11/05; H02K 11/046; H02K 11/33; H02K 11/30; H02K 3/28; H02K 9/06; H02K 5/141; H02K 5/20; H05K 7/2089
(Continued)

(56) References Cited

U.S. PATENT DOCUMENTS 4,849,803 A * 7/1989 Yamamoto .............. H01L 23/24
                                                   257/687
2008/0153211 A1  6/2008 Hamidi et al.
(Continued)

FOREIGN PATENT DOCUMENTS

JP     H 1167984       *  3/1999
JP     2013-039023 A      2/2013
JP     6006628 B2         10/2016

*Primary Examiner* — Ahmed Elnakib
(74) *Attorney, Agent, or Firm* — Oliff PLC

(57) ABSTRACT

A power semiconductor device includes a planar rectifying element, a base electrode, a first solder layer, a lead electrode, a second solder layer, and first and second sealing portions. The base electrode is electrically connected to the rectifying element via the first solder layer formed on a first surface of the rectifying element. The lead electrode is electrically connected to the rectifying element via the second solder layer formed on a second surface of the rectifying element. The first sealing portion is formed of a first resin and provided in a recess; the recess is formed by the first surface of the rectifying element and the first solder layer or by the second surface of the rectifying element and the second solder layer. The second sealing portion is formed of a second resin and separately from the first sealing portion to cover an outer surface of the first sealing portion.

11 Claims, 10 Drawing Sheets

(51) Int. Cl.
*H02K 11/33* (2016.01)
*H01L 23/367* (2006.01)
*H01L 21/56* (2006.01)
*H02K 11/05* (2016.01)
*H02K 11/04* (2016.01)

(52) U.S. Cl.
CPC .......... *H01L 23/482* (2013.01); *H02K 11/046* (2013.01); *H02K 11/05* (2016.01); *H02K 11/33* (2016.01)

(58) Field of Classification Search
USPC .................................. 310/68 D, 71
See application file for complete search history.

(56) References Cited

U.S. PATENT DOCUMENTS

| | | | |
|---|---|---|---|
| 2008/0166543 A1* | 7/2008 | Zhuo | H01L 24/83 428/323 |
| 2011/0001233 A1 | 1/2011 | Iwase et al. | |
| 2011/0192630 A1 | 8/2011 | Ishino et al. | |
| 2011/0290863 A1 | 12/2011 | Kajiwara et al. | |
| 2012/0199991 A1* | 8/2012 | Okamoto | H01L 23/3142 257/790 |
| 2013/0009298 A1 | 1/2013 | Ota et al. | |
| 2014/0264383 A1* | 9/2014 | Kajiwara | H01L 23/4952 257/77 |
| 2017/0263516 A1* | 9/2017 | Ishimaru | H01L 24/01 |
| 2019/0287871 A1* | 9/2019 | Hasegawa | H02K 11/33 |

* cited by examiner

POWER SEMICONDUCTOR DEVICE, ROTATING ELECTRIC MACHINE INCLUDING SAME, AND METHOD OF MANUFACTURING POWER SEMICONDUCTOR DEVICE

CROSS-REFERENCE TO RELATED APPLICATION

This application is based on and claims priority from Japanese Patent Application No. 2018-48766 filed on Mar. 16, 2018, the contents of which are hereby incorporated by reference in their entirety into this application.

BACKGROUND

1 Technical Field

The present invention relates to power semiconductor devices, rotating electric machines that include the power semiconductor devices, and methods of manufacturing the power semiconductor devices.

2 Description of Related Art

There are known rotating electric machines that generate torque upon being supplied with electric power and generate electric power upon being supplied with torque.

For example, Japanese Patent Publication No. JP6006628B2 discloses a rotating electric machine that includes a machine main body, which includes a stator and a rotor, and a control section electrically connected with an external battery and including a plurality of power semiconductor devices.

In the rotating electric machine disclosed in the above patent document, each of the power semiconductor devices of the control section includes: a mesa rectifying element, two solder layers respectively formed on two opposite end surfaces of the rectifying element; a base electrode electrically connected to one of the two solder layers; a lead electrode electrically connected to the other of the two solder layers; and a sealing portion that fixes the rectifying element to the base electrode and the lead electrode as well as seals the rectifying element and the two solder layers. In addition, the two solder layers are respectively formed on the entire base electrode-side end surface and the entire lead electrode-side end surface of the mesa rectifying element.

Moreover, a planar rectifying element, which has lower reverse current than the mesa rectifying element, may be employed instead of the mesa rectifying element in each of the power semiconductor devices of the control section.

In the planar rectifying element, an oxide film is formed on an outer peripheral portion of one of the base electrode-side and lead electrode-side end surfaces of the rectifying element to prevent the occurrence of a short circuit at a junction interface (e.g., a p-n junction interface or MOSFET interface) of the rectifying element.

Therefore, in forming the solder layers respectively on the base electrode-side and lead electrode-side end surfaces of the planar rectifying element, no solder flows to the oxide film on the end surface having the oxide film formed thereon.

Consequently, a recess may be formed between the end surface having the oxide film formed thereon and that one of the base electrode and the lead electrode which is electrically connected to the end surface having the oxide film formed thereon.

With the recess, in sealing the planar rectifying element and the solder layers with a resin, volatile components of the resin and gases (e.g., air), which are included in the resin during the filling of the resin into the recess, may be incompletely released and thus remain in the sealing portion that is obtained by curing the resin.

With the volatile components and gases remaining in the sealing portion, it may become easy for cracking and/or peeling to occur in the sealing portion, thereby lowering the retaining force of the sealing portion (i.e., the force of the sealing portion retaining the planar rectifying element).

Moreover, upon intrusion of water into gaps that are formed in the sealing portion by cracking of the sealing portion, it would become impossible to ensure the insulation properties of the planar rectifying element.

Furthermore, depending on the degree of cracking of the sealing portion, creeping discharge may occur in the power semiconductor device.

SUMMARY

According to the present disclosure, there is provided a power semiconductor device which includes a planar rectifying element, a base electrode, a first solder layer, a lead electrode, a second solder layer, a first sealing portion and a second sealing portion. The rectifying element has an opposite pair of first and second surfaces. The base electrode is electrically connected to the first surface of the rectifying element. The first solder layer is formed between the first surface of the rectifying element and the base electrode. The lead electrode is electrically connected to the second surface of the rectifying element. The second solder layer is formed between the second surface of the rectifying element and the lead electrode. The first sealing portion is formed of a first resin and provided in a recess; the recess is formed by the first surface of the rectifying element and the first solder layer or by the second surface of the rectifying element and the second solder layer. The second sealing portion is formed of a second resin. Moreover, the second sealing portion is formed separately from the first sealing portion to cover an outer surface of the first sealing portion; the outer surface of the first sealing portion is on the opposite side to an inner surface of the first sealing portion which is in contact with the first solder layer or the second solder layer.

With the above configuration, in manufacturing the power semiconductor device, the recess is filled with the first resin for forming the first sealing portion before the formation of the second sealing portion. Consequently, volatile components of the first resin for forming the first sealing portion and gases (e.g., air) included in the first resin can be released to the outside of the first resin without being blocked by the second sealing portion. That is, the volatile components of the first resin for forming the first sealing portion and the gases included in the first resin are prevented from remaining in the first sealing portion that is obtained by curing the first resin. As a result, it becomes possible to prevent cracking and peeling from occurring in the power semiconductor device due to voids in the first sealing portion. Accordingly, it becomes possible to maintain the retaining force of the first and second sealing portions (i.e., the force of the first and second sealing portions retaining the rectifying element); it also becomes possible to ensure the insulation properties of the rectifying element.

DESCRIPTION OF EMBODIMENTS

Figure 1:
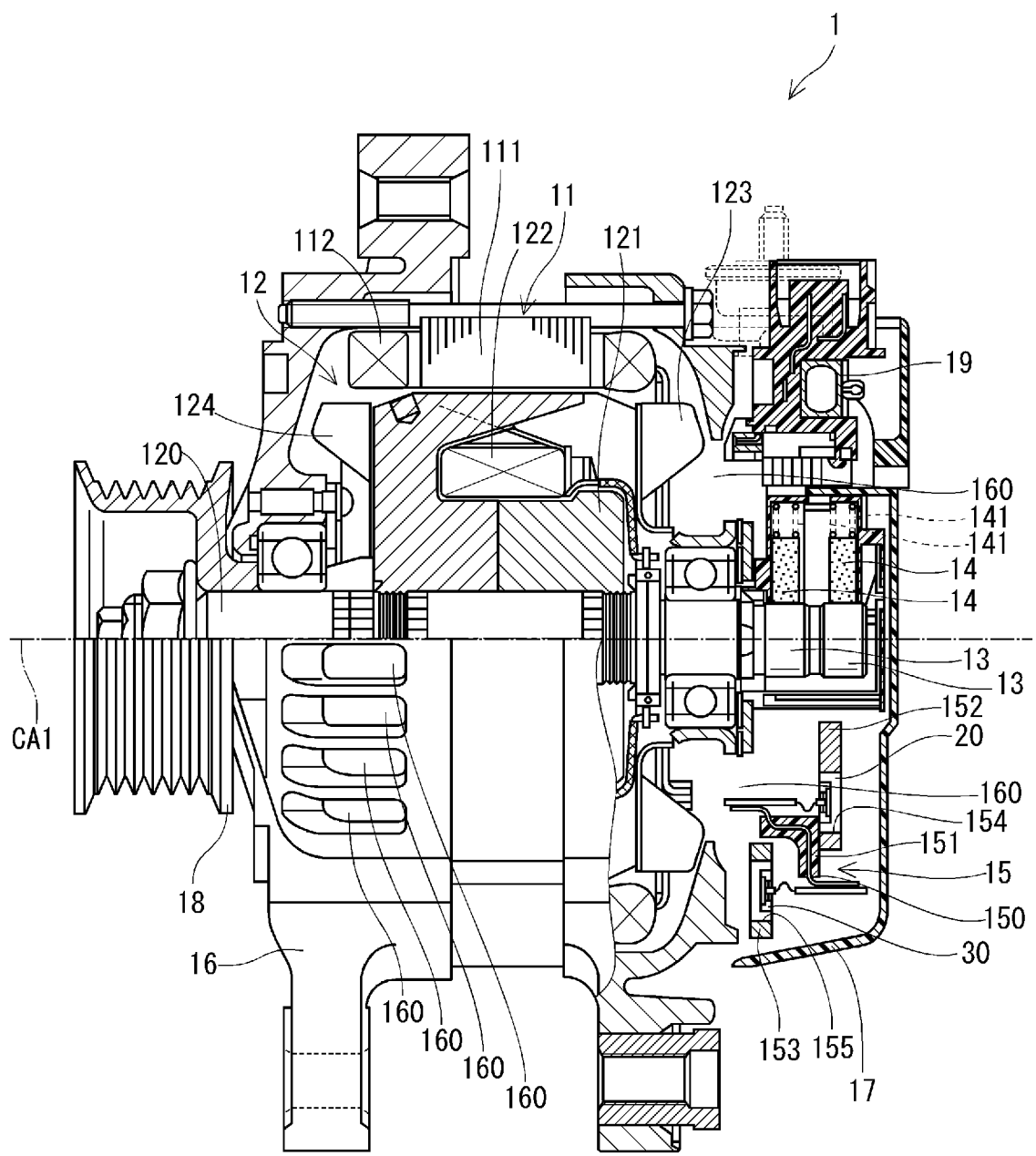
FIG. 1 is a cross-sectional view of a rotating electric machine which includes power semiconductor devices according to a first embodiment.

Exemplary embodiments will be described hereinafter with reference to FIGS. 1-10. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

FIG. 1 shows the overall configuration of a rotating electric machine 1 which includes semiconductor element units (i.e., power semiconductor devices) 20, 30 according to the first embodiment.

In the present embodiment, the rotating electric machine 1 is designed to be used in, for example, a vehicle. Moreover, the rotating electric machine 1 is configured as a motor-generator to selectively operate in a motor mode and a generator mode. In the motor mode, the rotating electric machine 1 generates, using electric power supplied from a battery B1 (see FIG. 2), drive power (or torque) for driving the vehicle. On the other hand, in the generator mode, the rotating electric machine 1 generates, using drive power supplied from an engine (not shown) of the vehicle, electric power for charging the battery B1.

As shown in FIG. 1, the rotating electric machine 1 includes a stator 11, a rotor 12, a pair of slip rings 13, a pair of brushes 14, a control section 15, a housing 16, a rear cover 17 and a pulley 18.

Figure 2:
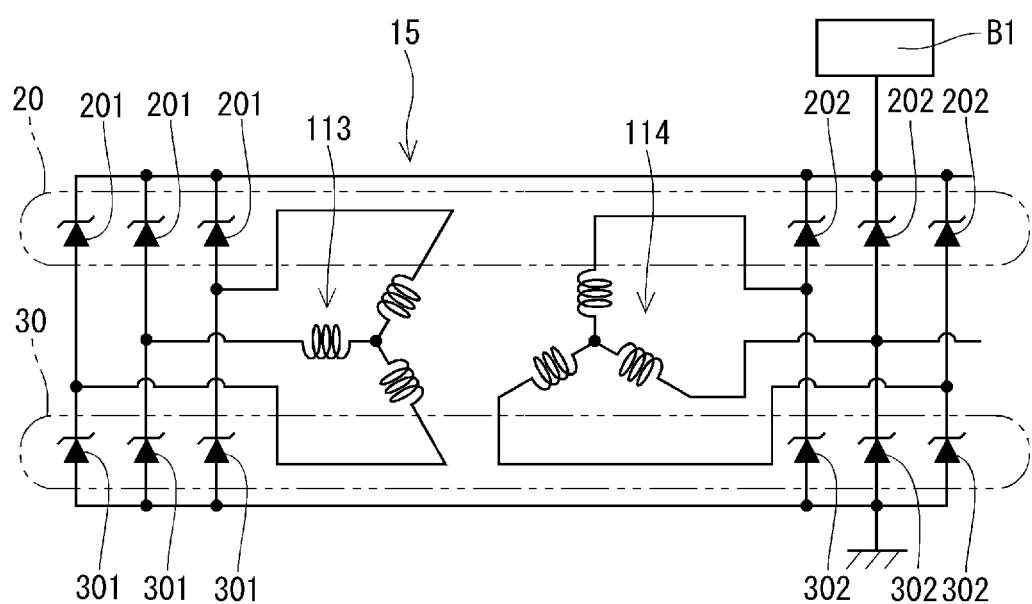
FIG. 2 is a circuit diagram of the rotating electric machine.

The stator 11 includes an annular stator core 111, which has a plurality of slots formed at predetermined intervals therein, and stator coils 112 wound on the stator core 111 so as to be received in the slots. More particularly, in the present embodiment, as shown in FIG. 2, the stator coils 112 consist of a first three-phase stator coil 113 and a second three-phase stator coil 114.

In addition, it should be noted that the number of phases of the stator coils 112 may alternatively be two, or four or more. It also should be noted that the number of the stator coils 112 included in the stator 11 may alternatively be one, or three or more.

In the motor mode of the rotating electric machine 1, the stator 11 creates a rotating magnetic field upon three-phase alternating current flowing in the stator coils 112. On the other hand, in the generator mode of the rotating electric machine 1, the stator 11 generates three-phase alternating current upon magnetic flux, which is generated by the rotor 12, crossing the stator coils 112.

The rotor 12 is rotatably provided radially inside the stator 11. The rotor 12 includes a rotor core 121 and a rotor coil 122. The rotor core 121 is fixed on a rotating shaft 120 to rotate together with the rotating shaft 120 about a rotation axis CA1 of the rotating shaft 120. The rotor coil 122 is formed, for example, of an insulated copper wire and wound on the rotor core 121. The rotor 12 forms magnetic poles upon direct current (i.e., excitation current) flowing in the rotor coil 122.

To a rear cover 17-side end surface of the rotor core 121, there is fixed a cooling fan 123 by welding. On the other hand, to a pulley 18-side end surface of the rotor core 121, there is fixed a cooling fan 124 by welding.

The slip rings 13 and the brushes 14 are provided for supplying direct current (i.e., excitation current) to the rotor coil 122. Each of the slip rings 13 is fixed to an outer circumferential surface of the rotating shaft 120 via an insulating member. The brushes 14 are held by a brush holder so that each of the brushes 14 has its distal end surface in pressed contact with an outer circumferential surface of a corresponding one of the slip rings 13. More specifically, each of the brushes 14 is pressed against the outer circumferential surface of the corresponding slip ring 13 by a spring 141 provided in the brush holder.

The control section 15 is provided on the rear cover 17 side of the rotor 12. The control section 15 includes a terminal block 151, a positive heat sink 152, a negative heat sink 153 and the semiconductor element units 20, 30.

Figure 3:
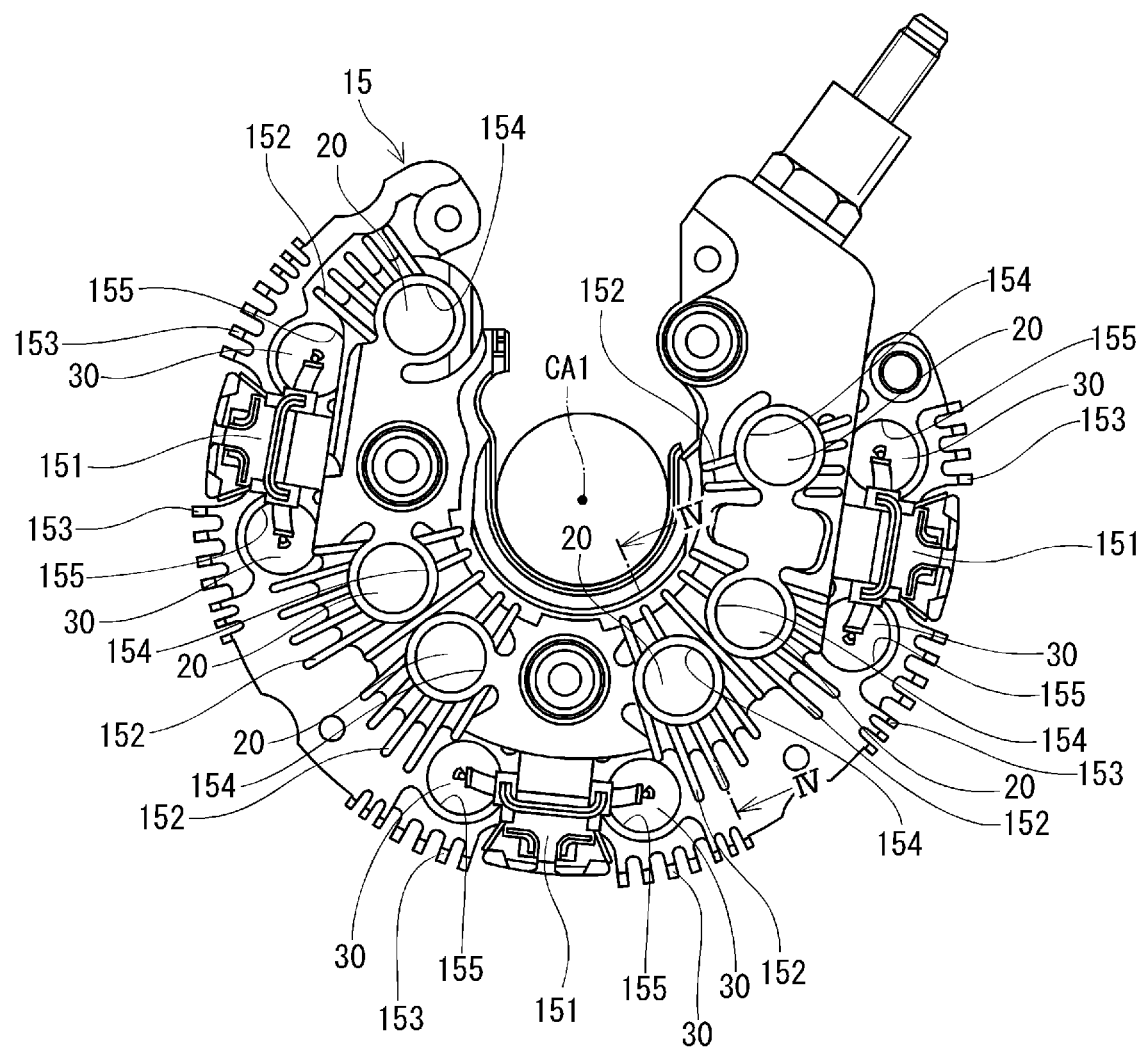
FIG. 3 is a plan view of a control section of the rotating electric machine.

As shown in FIG. 3, the terminal block 151 is provided radially outside the rotating shaft 120. The terminal block 151 has a wiring 150 provided therein.

The positive heat sink 152 has a plurality of heat-dissipating fins arranged at predetermined intervals on the radially inner side of the terminal block 151. In the positive heat sink 152, there are formed a plurality of press-fit holes 154 in which the semiconductor element units 20 are respectively press-fitted.

The negative heat sink 153 has a plurality of heat-dissipating fins arranged at predetermined intervals on the radially outer side of the terminal block 151. In the negative heat sink 153, there are formed a plurality of press-fit holes 155 in which the semiconductor element units 30 are respectively press-fitted.

As shown in FIG. 3, the semiconductor element units 20 and the semiconductor element units 30 are respectively arranged at two radial positions on the radially outer side of the rotating shaft 120. More specifically, the semiconductor element units 20 are arranged at a first radial position while the semiconductor element units 30 are arranged at a second radial position that is more radially outward than the first position.

In the present embodiment, as shown in FIGS. 2 and 3, a total of six semiconductor element units 20 and a total of six semiconductor element units 30 are provided in the control section 15.

Moreover, the semiconductor element units 20 consist of three semiconductor element units 201 electrically connected between the first three-phase stator coil 113 and the battery B1 and three semiconductor element units 202 electrically connected between the second three-phase stator coil 114 and the battery B1. The configuration of the semiconductor element units 20 will be described in detail later.

On the other hand, the semiconductor element units 30 consist of three semiconductor element units 301 electrically connected between the first three-phase stator coil 113 and the ground and three semiconductor element units 302 electrically connected between the second three-phase stator coil 114 and the ground.

The housing 16 accommodates both the stator 11 and the rotor 12 therein. More specifically, in the housing 16, the stator core 111 is arranged radially outside the rotor core 121 with a predetermined gap formed therebetween. The housing 16 also rotatably supports the rotating shaft 120 via a pair of bearings provided therein, so that the rotor 12 can rotate together with the rotating shaft 120. In addition, in the housing 16, there are formed a plurality of ventilation holes (i.e., through-holes) 160 through which cooling air can flow from the outside to the inside of the housing 16 and vice versa.

The rear cover 17 is located outside the housing 16 and mounted to a control section 15-side end wall of the housing 16. The rear cover 17 covers the slip rings 13, the brushes 14, the control section 15 and an IC regulator 19, so as to protect them from water and foreign matter.

Next, the configuration of the semiconductor element units 20 will be described with reference to FIGS. 4 and 5.

It should be noted that: in the present embodiment, the semiconductor element units 30 have substantially the same configuration as the semiconductor element units 20; therefore, for the sake of avoiding redundancy, description of the configuration of the semiconductor element units 30 is omitted hereinafter.

Figure 4:
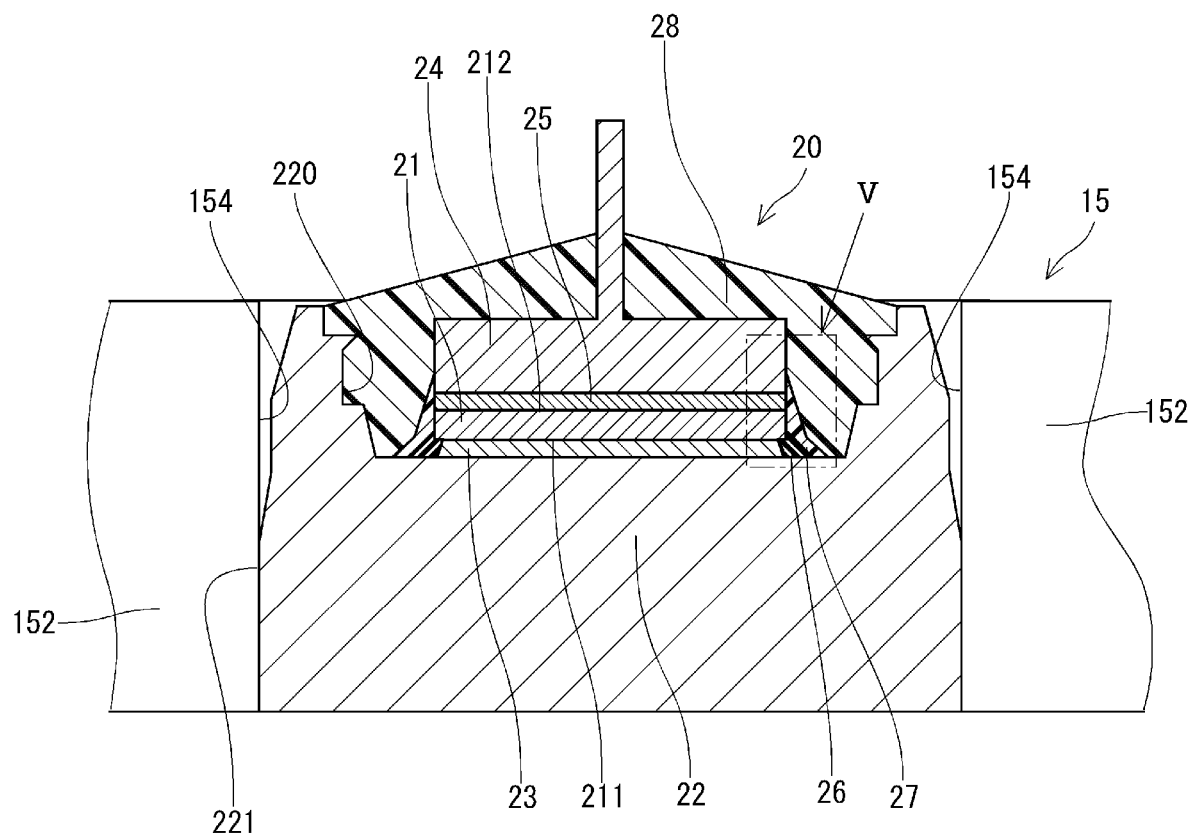
FIG. 4 is a cross-sectional view taken along the line IV-IV in FIG. 3.
Figure 5:
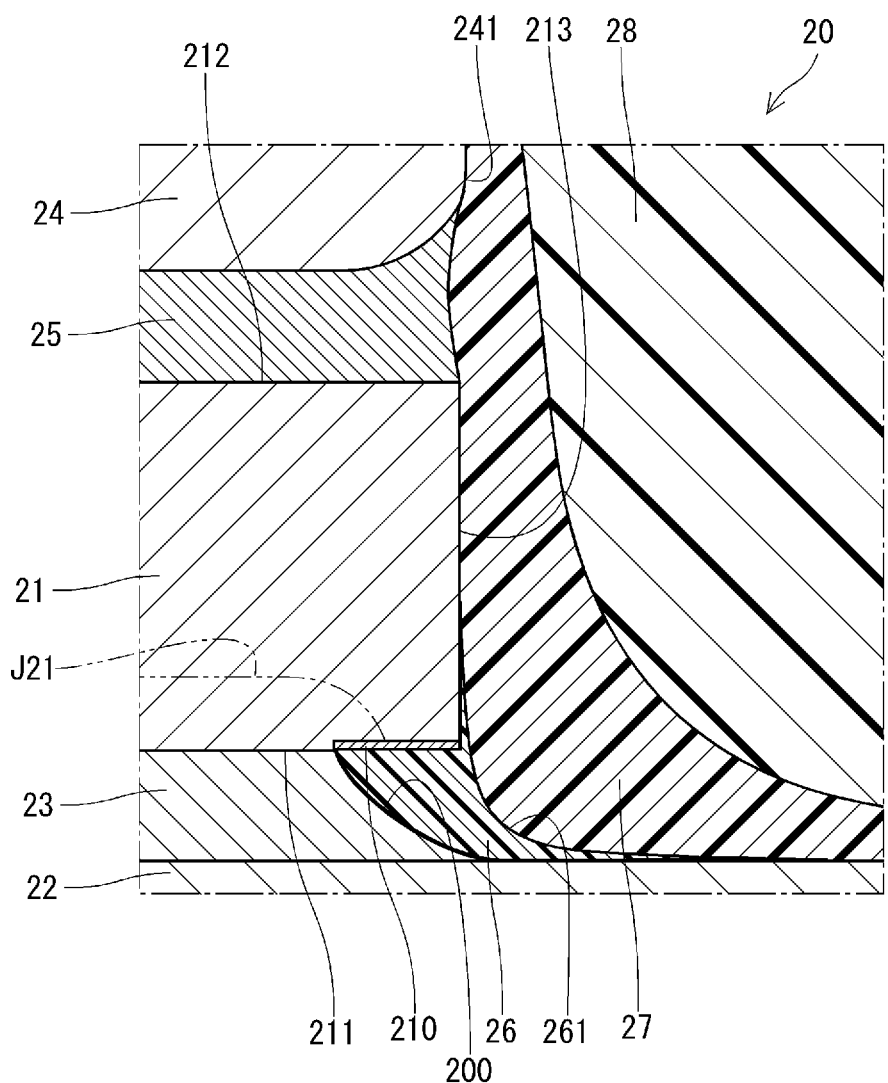
FIG. 5 is an enlarged view of a part V of FIG. 4.

As shown in FIGS. 4 and 5, each of the semiconductor element units 20 includes a semiconductor element 21, a base electrode 22, a first solder layer 23, a lead electrode 24, a second solder layer 25, a first sealing portion 26, a second sealing portion 27 and an outer sealing portion 28.

The semiconductor element 21 is a so-called planar rectifying element. The semiconductor element 21 has an opposite pair of first and second surfaces, i.e., a base electrode-side end surface 211 and a lead electrode-side end surface 212.

In the present embodiment, as shown in FIG. 5, the semiconductor element 21 has an oxide film 210 formed on an outer peripheral portion of the base electrode-side end surface 211 (i.e., the first surface) thereof. More specifically, the oxide film 210 is formed to cover an exposed portion of a junction interface (indicated with a two-dot chain line J21 in FIG. 5) of the semiconductor element 21 which is exposed on the base electrode-side end surface 211. In addition, the junction interface is an interface between different types of semiconductor materials, such as a p-n junction interface or a MOS-FET interface.

The base electrode 22 is made of metal and substantially cylindrical in shape. As shown in FIG. 4, in the state of the semiconductor element unit 20 being press-fitted in one of the press-fit holes 154 of the positive heat sink 152, the base electrode 22 has its radially-outer side surface 221 in abutment with an inner wall surface of the positive heat sink 152 which defines the press-fit hole 154. In one axial end surface (i.e., the upper end surface in FIG. 4) of the base electrode 22, there is formed a concave space 220 in which the semiconductor element 21 is mounted.

The first solder layer 23 is formed between the base electrode-side end surface 211 (i.e., the first surface) of the semiconductor element 21 and the base electrode 22. The first solder layer 23 joins and electrically connects the semiconductor element 21 and the base electrode 22 to each other.

In the present embodiment, the first solder layer 23 is formed on only the other portions of the base electrode-side end surface 211 of the semiconductor element 21 than the outer peripheral portion on which the oxide film 210 is formed. In other words, the first solder layer 23 is formed so as not to cover the oxide film 210 formed on the outer peripheral portion of the base electrode-side end surface 211 of the semiconductor element 21. Consequently, as shown in FIG. 5, a base electrode-side recess 200 is formed by the base electrode-side end surface 211 of the semiconductor element 21 and the first solder layer 23. In addition, in FIG. 5, for the sake of convenience, reference numeral 200 designates the side surface of the first solder layer 23 which defines the base electrode-side recess 200.

The lead electrode 24 is made of metal and substantially disc-shaped. The lead electrode 24 is electrically connected to the wiring 150 provided in the terminal block 151.

The second solder layer 25 is formed between the lead electrode-side end surface 212 (i.e., the second surface) of the semiconductor element 21 and the lead electrode 24. The second solder layer 25 joins and electrically connects the semiconductor element 21 and the lead electrode 24 to each other. The second solder layer 25 is formed on the entire lead electrode-side end surface 212.

The first sealing portion 26 is formed of a first resin such as a polyimide resin. As shown in FIG. 5, the first sealing portion 26 is formed to fill the base electrode-side recess 200. That is, the first sealing portion 26 is formed to cover the exposed portion of the junction interface of the semiconductor element 21 via the oxide film 210. The first sealing portion 26 is firmly adhered to the semiconductor element 21, the base electrode 22 and the first solder layer 23. In addition, the volume of the first sealing portion 26 is smaller than the volume of the second sealing portion 27 described below.

The second sealing portion 27 is formed of a second resin different from the first resin of which the first sealing portion 26 is formed (e.g., a polyimide resin different from the polyimide resin of which the first sealing portion 26 is formed). Moreover, the second sealing portion 27 is formed separately from the first sealing portion 26 to cover an outer surface 261 of the first sealing portion 26; the outer surface 261 is on the opposite side to an inner surface of the first sealing portion 26 which is in contact with the first solder layer 23. The second sealing portion 27 is firmly adhered to a radially-outer side surface 213 of the semiconductor element 21 and a radially-outer side surface 241 of the lead electrode 24.

The outer sealing portion 28 is formed of a third resin such as an epoxy resin. The outer sealing portion 28 is formed on the radially outer side of the second sealing portion 27. The outer sealing portion 28 is provided to fix the semiconductor element 21 in the concave space 220 and prevent water and foreign matter from making contact with any of the first solder layer 23, the semiconductor element 21 and the second solder layer 25.

Next, operation of the rotating electric machine 1 will be described with reference to FIGS. 1 and 2.

As described previously, in the present embodiment, the rotating electric machine 1 is configured as a motor-generator to selectively operate in a motor mode and a generator mode in a vehicle.

In the motor mode, upon an ignition switch (not shown) of the vehicle being turned on, direct current is supplied from the battery B1 to the rotor coil 122 via the brushes 14 and the slip rings 13, causing magnetic poles to be formed on a radially outer periphery of the rotor 12. At the same time, direct current is also supplied from the battery B1 to the control section 15. Then, the semiconductor element units 201 and 301, which together form a first inverter circuit, perform switching at predetermined timings, thereby converting the direct current supplied from the battery B1 into three-phase alternating current. Similarly, the semiconductor element units 202 and 302, which together form a second inverter circuit, also perform switching at predetermined timings, thereby converting the direct current supplied from the battery B1 into three-phase alternating current. However, the predetermined timings at which the semiconductor element units 202 and 302 perform switching are different from the predetermined timings at which the semiconductor element units 201 and 301 perform switching. Consequently, the three-phase alternating current outputted from the second inverter circuit is different in phase from the three-phase alternating current outputted from the first inverter circuit. The three-phase alternating current outputted from the first inverter circuit and the three-phase alternating current outputted from the second inverter circuit are respectively supplied to the first three-phase stator coil 113 and the second three-phase stator coil 114, causing driving power (or torque) to be generated at the rotating shaft 120 and transmitted via the pulley 18 to drive the vehicle.

In the generator mode, direct current is supplied from the battery B1 to the rotor coil 122 via the brushes 14 and the slip rings 13, causing magnetic poles to be formed on the radially outer periphery of the rotor 12. Moreover, drive power is transmitted from the engine of the vehicle to the pulley 18, causing three-phase alternating current to be generated in each of each of the first three-phase stator coil 113 and the second three-phase stator coil 114. Then, the semiconductor element units 201 and 301, which together form a first rectification circuit, perform switching at predetermined timings, thereby rectifying the three-phase alternating current generated in the first three-phase stator coil 113 into direct current. Similarly, the semiconductor element units 202 and 302, which together form a second rectification circuit, also perform switching at predetermined timings, thereby rectifying the three-phase alternating current generated in the second three-phase stator coil 114 into direct current. Both the direct current outputted from the first rectification circuit and the direct current outputted from the second rectification circuit are supplied to the battery B1 to charge it.

Next, a method of manufacturing the semiconductor element units 20 according to the present embodiment will be described with reference to FIGS. 6-9.

FIGS. 6-9 show change in the vicinity of the base electrode-side recess 200 in one of the semiconductor element units 20 during the manufacture of the semiconductor element unit 20 using the method according to the present embodiment. The method includes first to fourth steps.

Figure 6:
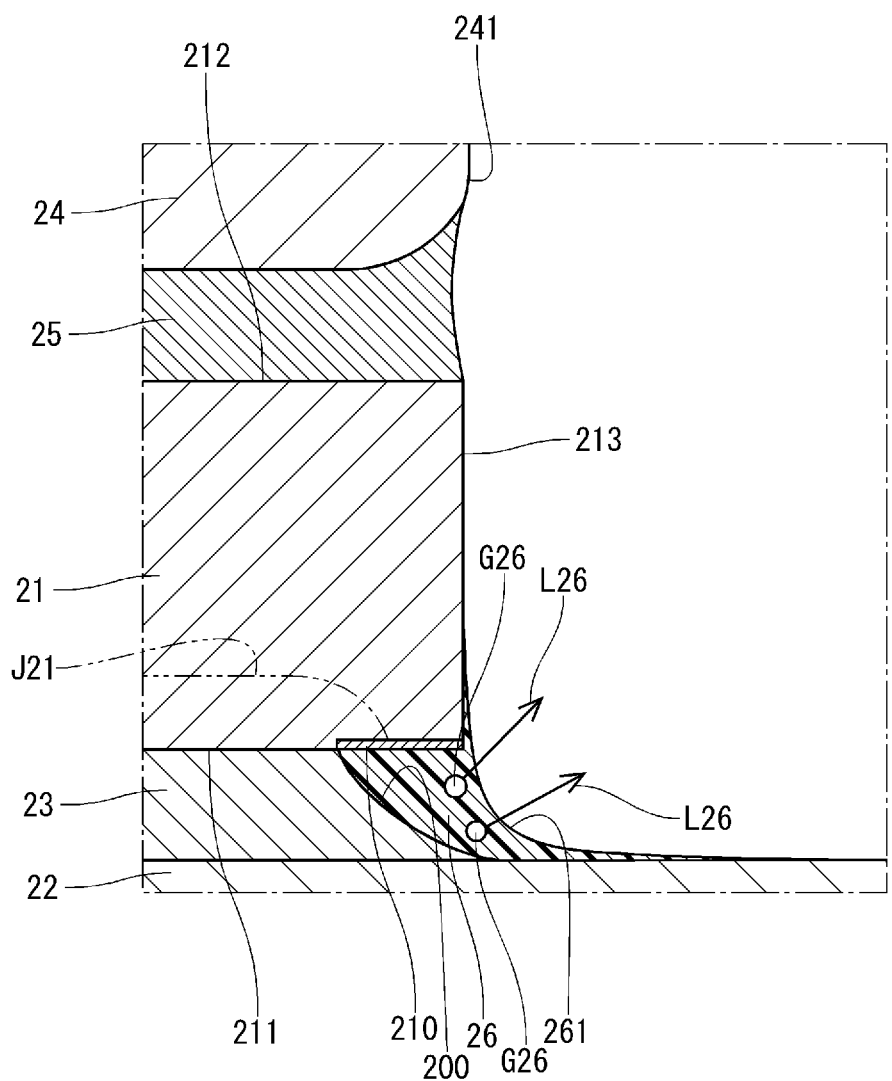
FIG. 6 is a schematic diagram illustrating a first step of a method of manufacturing the power semiconductor devices.

In the first step, as shown in FIG. 6, with the base electrode 22, the first solder layer 23, the semiconductor element 21, the second solder layer 25 and the lead electrode 24 being in a stacked state, the first resin for forming the first sealing portion 26, which is in a flowable state, is filled into the base electrode-side recess 200.

In FIG. 6, volatile components of the first resin and gases (e.g., air) that are included in the first resin during the filling of the first resin into the base electrode-side recess 200 are designated by reference sign G26. As indicted with arrows L26 in FIG. 6, the volatile components of the first resin and the gases included in the first resin are released to the outside of the first resin before the first resin is cured to form the first sealing portion 26.

In the present embodiment, that part of the first solder layer 23 which defines the base electrode-side recess 200 is overhang-shaped. Moreover, it is only necessary for the first resin for forming the first sealing portion 26 to be filled into the base electrode-side recess 200 that has a relatively small volume; therefore, the thickness of the first resin filled in the base electrode-side recess 200 can be made small. Consequently, with the small thickness of the first resin filled in the base electrode-side recess 200, the volatile components of the first resin and the gases included in the first resin can be easily released to the outside.

Moreover, employing a low-viscosity resin as the first resin for forming the first sealing portion 26, it is possible to further facilitate the release of the volatile components of the first resin and the gases included in the first resin to the outside. In addition, since the base electrode-side recess 200 has a relatively small volume, it is possible to employ a resin with relatively low strength as the first resin for forming the first sealing portion 26 while securing the necessary strength by the second sealing portion 27.

Figure 7:
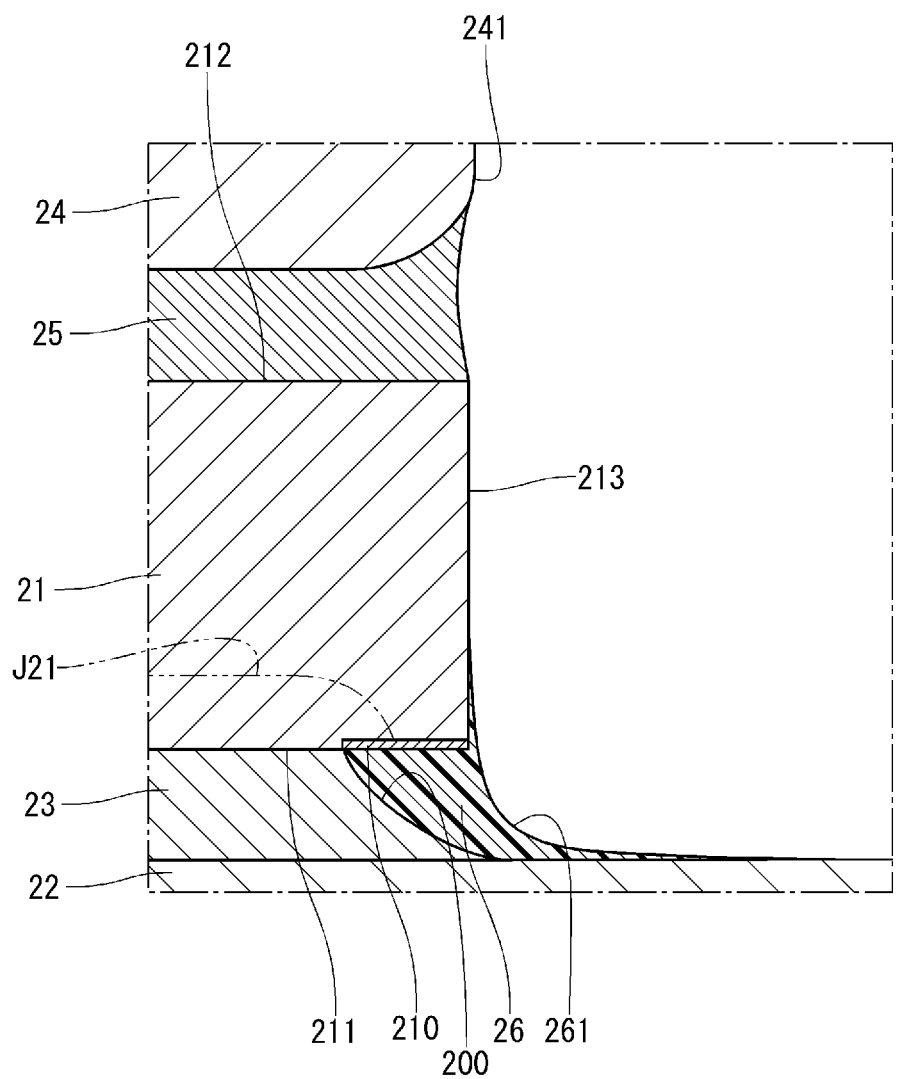
FIG. 7 is a schematic diagram illustrating a second step of the method.

In the second step, as shown in FIG. 7, the first resin filled into the base electrode-side recess 200 in the first step is cured to form the first sealing portion 26.

Figure 8:
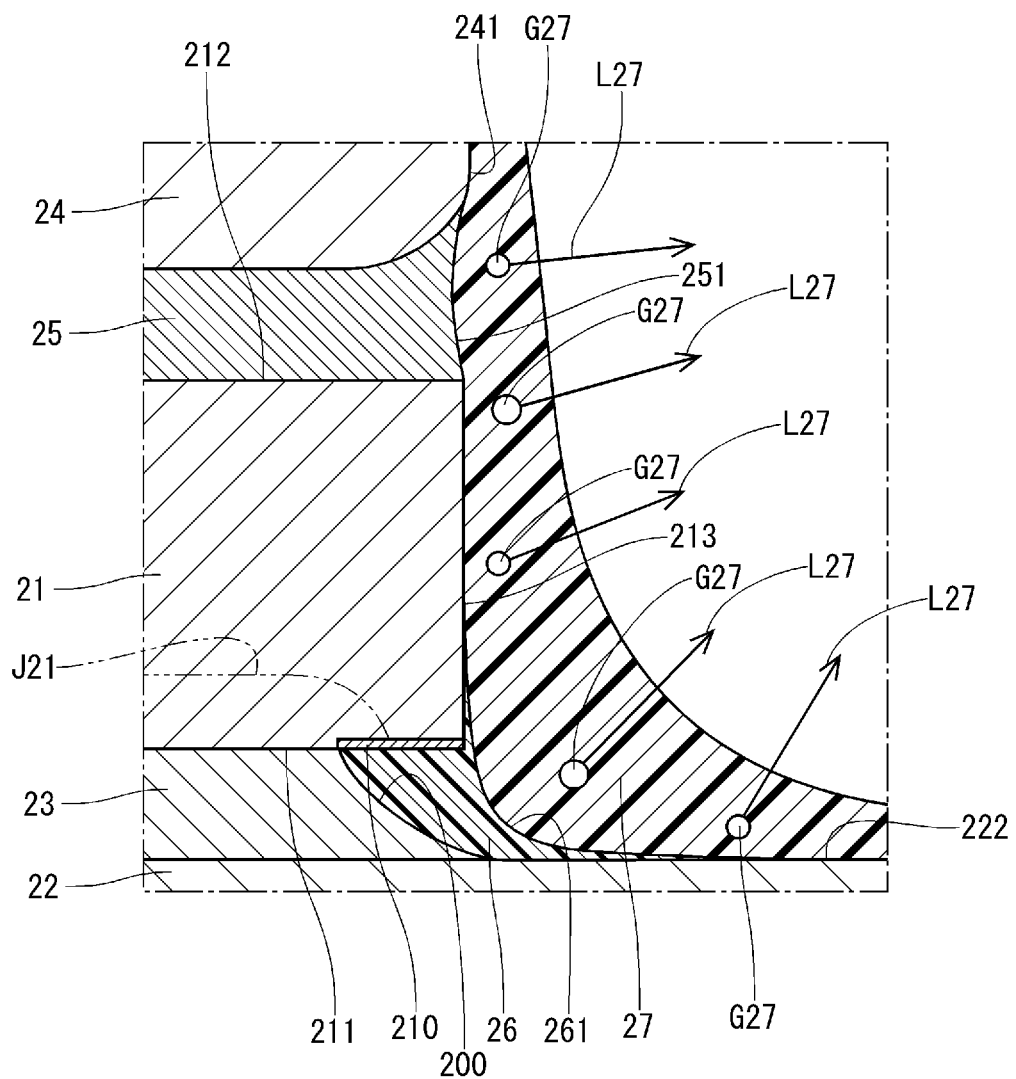
FIG. 8 is a schematic diagram illustrating a third step of the method.

In the third step, as shown in FIG. 8, the second resin for forming the second sealing portion 27, which is in a flowable state, is applied to cover the outer surface 261 of the first sealing portion 26. More specifically, in this step, the second resin for forming the second sealing portion 27 is applied to an end surface 222 of the base electrode 22 on the semiconductor element 21 side, the outer surface 261 of the first sealing portion 26, the side surface 213 of the semiconductor element 21, the side surface 251 of the second solder layer 25 and the side surface 241 of the lead electrode 24.

In FIG. 8, volatile components of the second resin for forming the second sealing portion 27 and gases (e.g., air) that are included in the second resin during the application thereof are designated by reference sign G27. As indicted with arrows L27 in FIG. 8, the volatile components of the second resin and the gases included in the second resin are released to the outside of the second resin before the second resin is cured to form the second sealing portion 27.

In the present embodiment, since the base electrode-side recess 200 is filled with the first sealing portion 26, the volatile components of the second resin for forming the second sealing portion 27 and the gases included in the second resin can be easily released to the outside of the second resin. Therefore, it is possible to employ a high-viscosity resin as the second resin for forming the second sealing portion 27, thereby increasing the strength and retaining force of the second sealing portion 27 that is obtained by curing the second resin. In addition, employing a high-viscosity resin as the second resin for forming the second sealing portion 27, it is possible to shorten the curing time of the second resin for forming the second sealing portion 27, thereby improving the productivity and lowering the manufacturing cost of the semiconductor element units 20.

In the present embodiment, the amount of the second resin applied in the third step for forming the second sealing portion 27 is larger than the amount of the first resin filled in the first step for forming the first sealing portion 26. Moreover, the second resin applied in the third step for forming the second sealing portion 27 is different from the first resin filled in the first step for forming the first sealing portion 26. Specifically, the adhesive strength of the second resin applied in the third step for forming the second sealing portion 27 is higher than the adhesive strength of the first resin filled in the first step for forming the first sealing portion 26. The pre-curing viscosity of the second resin applied in the third step for forming the second sealing portion 27 is higher than the pre-curing viscosity of the first resin filled in the first step for forming the first sealing portion 26.

Figure 9:
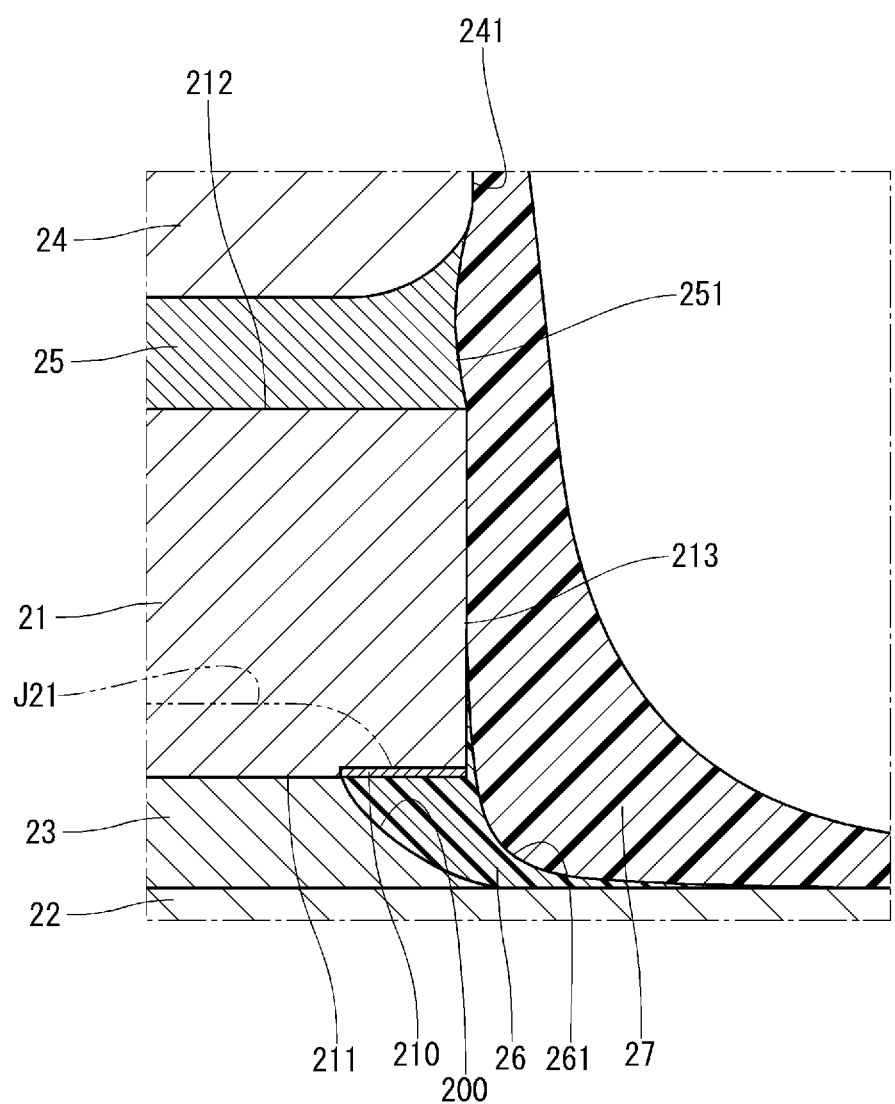
FIG. 9 is a schematic diagram illustrating a fourth step of the method.

Finally, in the fourth step, as shown in FIG. 9, the second resin applied to cover the outer surface 261 of the first sealing portion 26 in the third step is cured to form the second sealing portion 27.

According to the present embodiment, it is possible to achieve the following advantageous effects.

In the present embodiment, each of the semiconductor element units 20 includes the first sealing portion 26 provided in the base electrode-side recess 200 and the second sealing portion 27 formed separately from the first sealing portion 26 to cover the outer surface 261 of the first sealing portion 26. Therefore, in manufacturing the semiconductor element unit 20, the base electrode-side recess 200 is filled with the first resin for forming the first sealing portion 26 before the formation of the second sealing portion 27. Consequently, the volatile components of the first resin for forming the first sealing portion 26 and the gases included in the first resin can be released to the outside without being blocked by the second sealing portion 27. That is, the volatile components of the first resin for forming the first sealing portion 26 and the gases included in the first resin are prevented from remaining in the resultant first sealing portion 26. As a result, it becomes possible to prevent cracking and peeling from occurring in the semiconductor element unit 20 due to voids in the first sealing portion 26. Accordingly, it becomes possible to maintain the retaining force of the first sealing portion 26 and the second sealing portion 27 (i.e., the force of the first sealing portion 26 and the second sealing portion 27 retaining the semiconductor element 21); it also becomes possible to prevent insulation breakdown from occurring due to intrusion of water through gaps formed by cracking, thereby ensuring the insulation properties of the semiconductor element 21.

In the present embodiment, in each of the semiconductor element units 20, the volume of the first sealing portion 26 is smaller than the volume of the second sealing portion 27. Therefore, it becomes possible to reduce the amount of the volatile components and gases to be released from the first resin for forming the first sealing portion 26 after the first resin is filled into the base electrode-side recess 200; thus it becomes possible to reduce voids formed in the first sealing portion 26. As a result, it becomes possible to more reliably prevent cracking and peeling from occurring in the semiconductor element unit 20 due to voids in the first sealing portion 26.

In the present embodiment, in manufacturing the semiconductor element units 20, the pre-curing viscosity of the first resin filled in the first step for forming the first sealing portion 26 is lower than the pre-curing viscosity of the second resin applied in the third step for forming the second sealing portion 27. Consequently, as shown in FIG. 6, the relatively deep base electrode-side recess 200 can be reliably filled with the relatively low-viscosity first resin for forming the first sealing portion 26.

In the present embodiment, the second resin for forming the second sealing portion 27 is different from the first resin for forming the first sealing portion 26; the second resin for forming the second sealing portion 27 has relatively high adhesive strength. Consequently, it becomes difficult for the first sealing portion 26 and the second sealing portion 27 to be peeled.

In the present embodiment, after filling the first resin for forming the first sealing portion 26 into the base electrode-side recess 200 in the first step, the first resin is cured in the second step to form the first sealing portion 26. Consequently, the surface hardness of the first sealing portion 26 can be improved. As a result, it becomes possible to more reliably prevent peeling of the first sealing portion 26.

Second Embodiment

Figure 10:
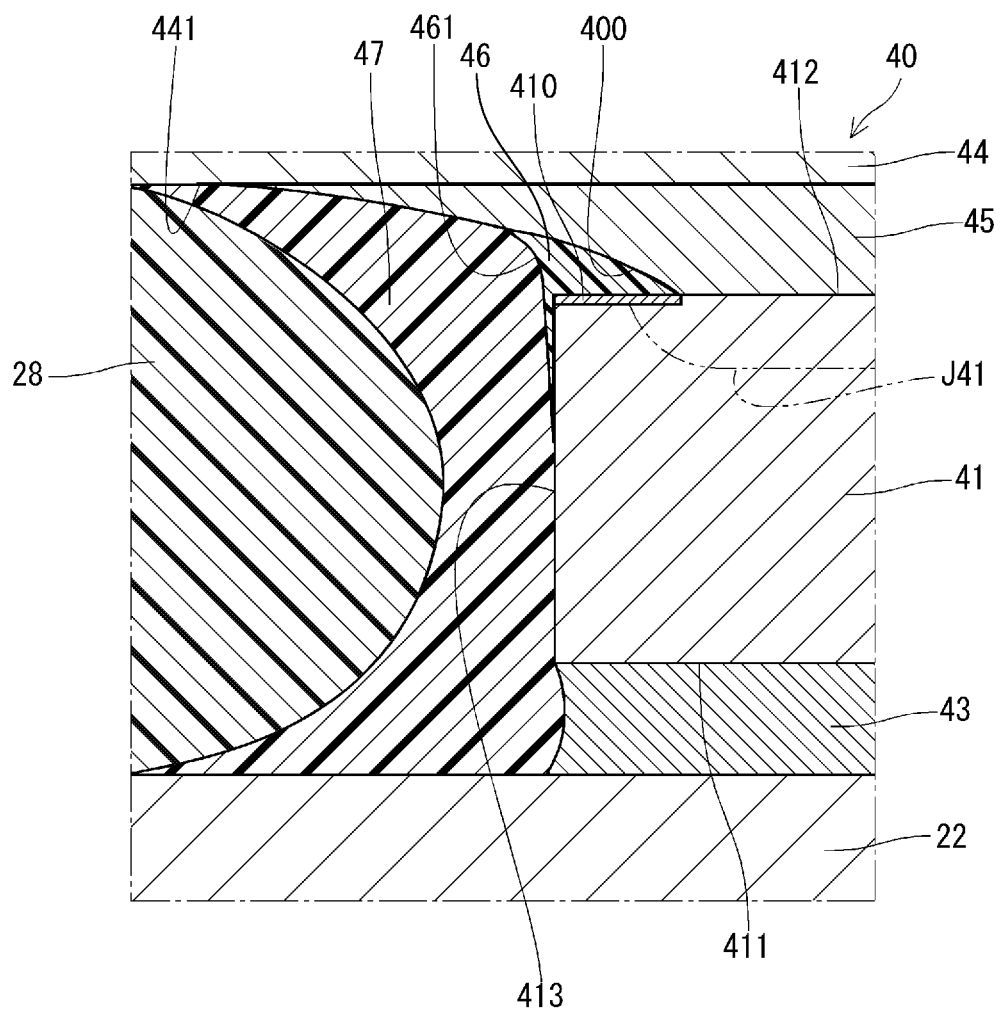
FIG. 10 is an enlarged cross-sectional view of part of a power semiconductor device according to a second embodiment.

FIG. 10 shows the configuration of a semiconductor element unit 40 (i.e., power semiconductor device) according to the second embodiment.

In addition, the semiconductor element unit 40 may be employed, for example, as one of the semiconductor element units 30 in the control section 15 of the rotating electric machine 1 described in the first embodiment.

As shown in FIG. 10, the semiconductor element unit 40 includes a semiconductor element 41, a base electrode 22, a first solder layer 43, a lead electrode 44, a second solder layer 45, a first sealing portion 46, a second sealing portion 47 and an outer sealing portion 28.

The semiconductor element 41 is a planar rectifying element. The semiconductor element 21 has an opposite pair of first and second surfaces, i.e., a base electrode-side end surface 411 and a lead electrode-side end surface 412.

As shown in FIG. 10, the semiconductor element 41 has an oxide film 410 formed on an outer peripheral portion of the lead electrode-side end surface 412 (i.e., the second surface) thereof. More specifically, the oxide film 410 is formed to cover an exposed portion of a junction interface (indicated with a two-dot chain line J41 in FIG. 10) of the semiconductor element 41 which is exposed on the lead electrode-side end surface 412. In addition, the junction interface is an interface between different types of semiconductor materials, such as a p-n junction interface or a MOS-FET interface.

In the present embodiment, the lead electrode 44 is larger in size than the lead electrode 24 in the first embodiment. The exposed portion of the junction interface of the semiconductor element 41 is exposed on the lead electrode-side end surface 412 to effectively dissipate, via the lead electrode 44, heat generated at the junction interface.

The first solder layer 43 is formed between the base electrode-side end surface 411 (i.e., the first surface) of the semiconductor element 41 and the base electrode 22. The first solder layer 43 joins and electrically connects the semiconductor element 41 and the base electrode 22 to each other. The first solder layer 43 is formed on the entire base electrode-side end surface 411.

The lead electrode 44 is made of metal and substantially disc-shaped. The lead electrode 44 has a larger outer diameter than the lead electrode 24 in the first embodiment. The lead electrode 44 is electrically connected to the wiring 150 provided in the terminal block 151.

The second solder layer 45 is formed between the lead electrode-side end surface 412 (i.e., the second surface) of the semiconductor element 41 and the lead electrode 44. The second solder layer 45 joins and electrically connects the semiconductor element 41 and the lead electrode 44 to each other.

In the present embodiment, the second solder layer 45 is formed on only the other portions of the lead electrode-side end surface 412 of the semiconductor element 41 than the outer peripheral portion on which the oxide film 410 is formed. In other words, the second solder layer 45 is formed so as not to cover the oxide film 410 formed on the outer peripheral portion of the lead electrode-side end surface 412 of the semiconductor element 41. Consequently, as shown in FIG. 10, a lead electrode-side recess 400 is formed by the lead electrode-side end surface 412 of the semiconductor element 41 and the second solder layer 45. In addition, in FIG. 10, for the sake of convenience, reference numeral 400 designates the side surface of the second solder layer 45 which defines the lead electrode-side recess 400.

The first sealing portion 46 is formed of a first resin to fill the lead electrode-side recess 400. That is, the first sealing portion 46 is formed to cover the exposed portion of the junction interface of the semiconductor element 41 via the oxide film 410. The first sealing portion 46 is firmly adhered to the semiconductor element 41 and the second solder layer 45. In addition, the volume of the first sealing portion 46 is smaller than the volume of the second sealing portion 47 described below.

The second sealing portion 47 is formed of a second resin different from the first resin of which the first sealing portion 46 is formed. Moreover, the second sealing portion 47 is formed separately from the first sealing portion 46 to cover an outer surface 461 of the first sealing portion 46; the outer surface 461 is on the opposite side to an inner surface of the first sealing portion 46 which is in contact with the second solder layer 45. The second sealing portion 27 is firmly adhered to a radially-outer side surface 413 of the semiconductor element 41 and an end surface 441 of the lead electrode 44 on the semiconductor element 41 side.

The outer sealing portion 28 is formed on the radially outer side of the second sealing portion 47. The outer sealing portion 28 is provided to prevent water and foreign matter from making contact with any of the first solder layer 43, the semiconductor element 41 and the second solder layer 45.

According to the present embodiment, it is also possible to achieve the same advantageous effects as described in the first embodiment.

While the above particular embodiments have been shown and described, it will be understood by those skilled in the art that various modifications, changes, and improvements may be made without departing from the spirit of the present disclosure.

For example, in the first embodiment, the rotating electric machine 1 is designed to be used in a vehicle. However, the present disclosure can also be applied to rotating electric machines for other uses.

In the above-described embodiments, the first sealing portion and the second sealing portion are formed of different resins. However, they may alternatively be formed of the same type of resin. In this case, the first sealing portion and the second sealing portion are only entangled with each other at the interface therebetween; therefore, the adhesive strength between them is relatively low. Consequently, even if the second sealing portion is peeled, the first sealing portion is hardly peeled together with the second sealing portion, thereby securing sealing by the first sealing portion.

In the above-described embodiments, in the first step, the first resin for forming the first sealing portion is filled all at once into the base electrode-side recess or the lead electrode-side recess. However, the first resin for forming the first sealing portion may alternatively be filled in plural steps. In this case, it is possible to facilitate the release of volatile components of the first resin for forming the first sealing portion and gases included in the first resin to the outside of the first resin. The above modification can also be made to the application of the second resin for forming the second sealing portion in the third step.

In the first embodiment, the base electrode-side recess is formed by the base electrode-side end surface of the semiconductor element and the first solder layer. Moreover, in the second embodiment, the lead electrode-side recess is formed by the lead electrode-side end surface of the semiconductor element and the second solder layer. However, the base electrode-side recess and the lead electrode-side recess may alternatively be formed in other manners. For example, the base electrode-side recess may alternatively be formed by the base electrode-side end surface of the semiconductor element, the first solder layer and the end surface of the base electrode on the semiconductor element side.

In the first embodiment, the stator 11 includes two three-phase stator coils, i.e., the first three-phase stator coil 113 and the second three-phase stator coil 114. Moreover, the semiconductor element units forming the first inverter circuit that converts the direct current supplied from the battery B1 into the three-phase alternating current supplied to the first three-phase stator coil 113 perform switching at different timings from the semiconductor element units forming the second inverter circuit that converts the direct current supplied from the battery B1 into the three-phase alternating current supplied to the second three-phase stator coil 114. However, the stator 11 may alternatively include only one three-phase stator coil.

In addition, in the first embodiment, by setting the timings at which the semiconductor element units forming the first inverter circuit perform switching to be different from the timings at which the semiconductor element units forming the second inverter circuit perform switching, it is possible to reduce noise included in the three-phase alternating currents outputted from the first and second inverter circuits.

What is claimed is:

1. A power semiconductor device comprising:
   a planar rectifying element having an opposite pair of first and second surfaces;
   a base electrode electrically connected to the first surface of the rectifying element;
   a first solder layer formed between the first surface of the rectifying element and the base electrode;
   a lead electrode electrically connected to the second surface of the rectifying element;
   a second solder layer formed between the second surface of the rectifying element and the lead electrode;
   a first sealing portion formed of a first resin and provided in a recess, the recess being formed by the first surface of the rectifying element and the first solder layer or by the second surface of the rectifying element and the second solder layer; and
   a second sealing portion formed of a second resin, the second sealing portion being formed separately from the first sealing portion to cover, and thus be in direct contact with, (i) an outer surface of the first sealing portion and (ii) a side surface of the planar rectifying element, the outer surface of the first sealing portion being on an opposite side to an inner surface of the first sealing portion which is in contact with the first solder layer or the second solder layer.

2. The power semiconductor device as set forth in claim 1, wherein a volume of the first sealing portion is smaller than a volume of the second sealing portion.

3. The power semiconductor device as set forth in claim 1, wherein a pre-curing viscosity of the first resin of which the first sealing portion is formed is different from a pre-curing viscosity of the second resin of which the second sealing portion is formed.

4. The power semiconductor device as set forth in claim 1, wherein the first resin of which the first sealing portion is formed is different from the second resin of which the second sealing portion is formed.

5. A rotating electric machine comprising:
   a stator including a stator coil;
   a rotor; and
   the power semiconductor device as set forth in claim 1, the power semiconductor device being electrically connected with the stator coil to rectify alternating current generated in the stator coil into direct current.

6. A method of manufacturing the power semiconductor device as set forth in claim 1, the method comprising:
   a first step of filling the first resin, which is provided for forming the first sealing portion, into the recess;
   a second step of curing the first resin, which is filled into the recess in the first step, to form the first sealing portion;
   a third step of applying the second resin, which is provided for forming the second sealing portion, to cover, and thus be in direct contact with, (i) the outer surface of the first sealing portion and (ii) the side surface of the planar rectifying element; and
   a fourth step of curing the second resin, which is applied in the third step to cover the outer surface of the first sealing portion and the side surface of the planar rectifying element, to form the second sealing portion.

7. The method as set forth in claim 6, wherein an amount of the first resin filled into the recess in the first step is different from an amount of the second resin applied in the third step to cover the outer surface of the first sealing portion and the side surface of the planar rectifying element.

8. The method as set forth in claim 7, wherein the amount of the first resin filled into the recess in the first step is smaller than the amount of the second resin applied in the third step to cover the outer surface of the first sealing portion and the side surface of the planar rectifying element.

9. The method as set forth in claim 6, wherein a viscosity of the first resin filled into the recess in the first step is different from a viscosity of the second resin applied in the third step to cover the outer surface of the first sealing portion and the side surface of the planar rectifying element.

10. The method as set forth in claim 9, wherein the viscosity of the first resin filled into the recess in the first step is lower than the viscosity of the second resin applied in the third step to cover the outer surface of the first sealing portion and the side surface of the planar rectifying element.

11. The method as set forth in claim 6, wherein the first resin filled into the recess in the first step is different from the second resin applied in the third step to cover the outer surface of the first sealing portion and the side surface of the planar rectifying element.

* * * * *